United States Patent
Lee

(10) Patent No.: US 8,411,503 B2
(45) Date of Patent: Apr. 2, 2013

(54) METHOD OF OPERATING SEMICONDUCTOR MEMORY DEVICE

(75) Inventor: Min Kyu Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 167 days.

(21) Appl. No.: 12/982,302

(22) Filed: Dec. 30, 2010

(65) Prior Publication Data

US 2011/0267895 A1  Nov. 3, 2011

(30) Foreign Application Priority Data

Apr. 29, 2010 (KR) .................. 10-2010-0039892

(51) Int. Cl.
*G11C 11/34* (2006.01)

(52) U.S. Cl. ......... 365/185.03; 365/185.12; 365/185.17; 365/185.18; 365/185.19; 365/185.24; 365/185.25; 365/185.29; 365/185.33

(58) Field of Classification Search ............ 365/185.03, 365/185.12, 185.17, 185.18, 185.19, 185.24, 365/185.25, 185.28, 185.29, 185.33
See application file for complete search history.

(56) References Cited

U.S. PATENT DOCUMENTS

| | | | | |
|---|---|---|---|---|
| 6,594,178 B2* | 7/2003 | Choi et al. | ............... | 365/185.17 |
| 7,170,793 B2* | 1/2007 | Guterman | ............... | 365/185.17 |
| 7,411,827 B2* | 8/2008 | Guterman et al. | ....... | 365/185.17 |
| 7,616,481 B2* | 11/2009 | Mokhlesi et al. | ........ | 365/185.03 |
| 7,773,429 B2* | 8/2010 | Jeon et al. | ............... | 365/185.17 |
| 7,787,306 B2* | 8/2010 | Park et al. | ................ | 365/185.17 |
| 7,800,946 B2* | 9/2010 | Kim et al. | ................ | 365/185.18 |
| 7,965,558 B2* | 6/2011 | Chae et al. | ............... | 365/185.19 |
| 8,009,472 B2* | 8/2011 | Murin et al. | ................ | 365/185.03 |
| 8,081,514 B2* | 12/2011 | Mui et al. | ................ | 365/185.17 |
| 8,149,620 B2* | 4/2012 | Kang | ....................... | 365/185.17 |
| 8,154,918 B2* | 4/2012 | Sharon et al. | ........... | 365/185.12 |
| 8,228,734 B2* | 7/2012 | Wang | ....................... | 365/185.24 |
| 2007/0297247 A1 | 12/2007 | Hemink | | |

FOREIGN PATENT DOCUMENTS

KR   1020050007653   1/2005

(Continued)

OTHER PUBLICATIONS

Notice of Allowance issued from Korean Intellectual Property Office on Mar. 26, 2012.

(Continued)

*Primary Examiner* — Trong Phan
(74) *Attorney, Agent, or Firm* — IP & T Group LLP

(57) ABSTRACT

A method of operating a semiconductor memory device includes applying a program pass voltage to unselected word lines, applying a program voltage of a third level to a selected word line in order to raise threshold voltages of third memory cells, decreasing a level of the program voltage from the third level to a second level and discharging channel regions of second cell strings including second memory cells in order to raise threshold voltages of second memory cells, and decreasing a level of the program voltage from the second level to a first level and discharging channel regions of first cell strings including first memory cells in order to raise threshold voltages of first memory cells. The cell strings are disconnected from a bit line while a voltage level of the unselected word lines rises to a level of the program pass voltage.

14 Claims, 10 Drawing Sheets

FOREIGN PATENT DOCUMENTS

| | | |
|---|---|---|
| KR | 1020060030171 | 4/2006 |
| KR | 1020080058743 | 6/2008 |
| KR | 1020090089427 | 8/2009 |
| KR | 1020090108267 | 10/2009 |
| KR | 1020100133616 | 12/2010 |
| KR | 1020110133258 | 12/2011 |

OTHER PUBLICATIONS

Notice of Preliminary Rejection issued from Korean Intellectual Property Office on Jul. 29, 2011.

\* cited by examiner

METHOD OF OPERATING SEMICONDUCTOR MEMORY DEVICE

CROSS-REFERENCE TO RELATED APPLICATION

Priority to Korean patent application number 10-2010-0039892 filed on Apr. 29, 2010, the entire disclosure of which is incorporated by reference herein, is claimed.

BACKGROUND

Exemplary embodiments relate to a method of operating a semiconductor memory device and, more particularly, to a method of operating a semiconductor memory device for storing data.

A NAND flash memory device is an example of a nonvolatile memory device. In order to increase the data storage capacity of the NAND flash memory device, data of 2 bits is stored in one memory cell. A memory cell has a threshold voltage varying according to the bit of data stored therein. That is, the threshold voltage of a memory cell is to be changed to store the data. The threshold voltage of a memory cell is changed by a program operation.

FIG. 1 is a circuit diagram illustrating the memory block of a NAND flash memory device.

Referring to FIG. 1, the NAND flash memory device includes a plurality of memory blocks. Each of the memory blocks includes a plurality of strings ST. The strings ST are coupled to respective bit lines BL0 to BLk and coupled to a common source CS. Each of the cell strings ST includes a drain select transistor coupled to a bit line (for example, the bit line BL1), a source select transistor coupled to the common source CS, and memory cells coupled in series between the drain select transistor and the source select transistor. The memory cells coupled in series constitute a memory string, and the drain select transistor becomes a cell string connection element for coupling the memory string to a bit line. The gates of the drain select transistors of the memory block are coupled to a drain select line DSL, and the gates of the source select transistors thereof are coupled to a source select line SSL. The gates of the memory cells are coupled to respective word lines WL0 to WLn. Meanwhile, the memory cells coupled to one word line (for example, WL0) constitute a page PB. One page PG may be divided into an even page, including the memory cells coupled to even-numbered bit lines, and an odd page including the memory cells coupled to odd-numbered bit lines. A program voltage and a program pass voltage for a program operation are supplied to the word lines WL0 to WLn. A ground voltage and a program inhibition voltage are selectively supplied to the bit lines BL0 to BLk according to data to be stored in corresponding memory cells. How the threshold voltages of memory cells are changed by a Least Significant Bit (hereinafter referred to as 'LSB') program operation and a Most Significant Bit (hereinafter referred to as 'MSB') program operation for storing data of 2 bits in a memory cell is described below.

FIGS. 2A and 2B are graphs illustrating a shift of the threshold voltages of memory cells according to a program operation.

Referring to FIG. 2A, prior to a program operation, all the memory cells are set to an erase state. That is, the threshold voltages of the memory cells drop to less than 0 V, and data stored in the memory cells is reset to '11'. Next, an LSB program operation is performed on memory cells selected from among the memory cells. Here, memory cells in which LSB data of '0' is stored according to external inputted data are selected. The threshold voltages of the selected memory cells become higher than 0 V and the LSB data of the selected memory cells is changed from '1' to '0' by the LSB program operation. That is, the data stored in the selected memory cells are changed to '10'.

Referring to FIG. 2B, an MSB program operation is performed on memory cells selected from among all the memory cells. Here, memory cells in which MSB data of '0' is stored according to external inputted data are selected. The threshold voltages of the selected memory cells are raised to three different levels PV1, PV2, and PV3 according to LSB data and MSB data of the selected memory cells by the MSB program operation. The MSB data of the memory cells is changed from '1' to '0'. More particularly, the threshold voltages of memory cells having the LSB data maintained at '1' and the MSB data changed (or stored) to '0', from among the selected memory cells, rise up to the first program level PV1 higher than 0 V. The threshold voltages of memory cells having the LSB data changed (or stored) to '0' and the MSB data maintained at '1', from among the selected memory cells, rise up to the second program level PV2 higher than the first program level PV1. The threshold voltages of memory cells having both the LSB data and the MSB data changed (or stored) to '0', from among the selected memory cells, rise up to the third program level PV3 higher than the second program level PV2.

For the LSB program operation or the MSB program operation, a program voltage is supplied to a selected word line, and a program pass voltage is supplied to unselected word lines. However, in order to raise the threshold voltages of the memory cells up to the three different program levels PV1 to PV3 in the MSB program operation, the program voltage is to be supplied to the selected word line several times. That is, a program pulse for raising the threshold voltages to the first program level PV1, a program pulse for raising the threshold voltages to the second program level PV2, and a program pulse for raising the threshold voltages to the third program level PV3 are to be supplied to the selected word line. As several program pulses are supplied in the single MSB program operation as described above, the program operation time may be increased.

BRIEF SUMMARY

Exemplary embodiments relate to a method of operating a semiconductor memory device, which is capable of increasing the speed of a program operation in which the threshold voltages of memory cells are raised up to different levels and of improving electrical characteristics and reliability of the semiconductor memory device by preventing errors in a program operation occurring owing to a change of voltages supplied during the program operation.

A method of operating a semiconductor memory device according to an aspect of the present disclosure includes selecting one of a plurality of word lines, applying a program voltage, gradually dropping from a third level to a first level, to the selected word line, and discharging bit lines whenever a level of the program voltage is changed.

When the program voltage of the third level is supplied to the selected word line, a program permission voltage is supplied to the bit lines of memory cells for storing third program data and the program inhibition voltage is supplied to the remaining bit lines. When the program voltage of the second level is supplied to the selected word line, the program permission voltage is supplied to the bit lines of memory cells for storing the third program data or second program data and the program inhibition voltage is supplied to the remaining bit lines. Furthermore, when the program voltage of the first level is supplied to the selected word line, the program permission voltage is supplied to the bit lines of memory cells for storing the second program data or the first program data and the program inhibition voltage is supplied to remaining bit lines.

When the bit lines are discharged, a coupling of the memory cells, coupled to the selected word line, and with the bit lines is blocked.

After the bit lines are discharged, a level of the program inhibition voltage rises whenever the program inhibition voltage is supplied.

Whenever a level of the program voltage is changed, the level of a pass voltage supplied to unselected selected word lines rises.

A method of operating a semiconductor memory device according to another aspect of the present disclosure includes coupling cell strings, comprising memory cells having gates coupled to respective word lines, to respective bit lines, discharging the channel regions of third cell strings including third memory cells and precharging the channel regions of the remaining cell strings, applying a program pass voltage to unselected word lines, applying a program voltage of a third level to a selected word line in order to raise threshold voltages of the third memory cells, decreasing a level of the program voltage from the third level to a second level and discharging the channel regions of second cell strings including second memory cells in order to raise threshold voltages of the second memory cells, and decreasing a level of the program voltage from the second level to a first level and discharging the channel regions of first cell strings including first memory cells in order to raise threshold voltages of the first memory cells, wherein the cell strings are disconnected from a bit line while a voltage level of the unselected word lines rises to a level of the program pass voltage.

In the state in which the coupling of the cell strings and with the bit lines is blocked, the levels of bit line voltages of the bit lines are changed to a program permission level and the channel regions are then discharged by connecting the cell strings and the bit lines.

The program pass voltage risers whenever the channel regions are discharged.

A program inhibition voltage supplied to the bit lines in order to precharge the channel regions rises whenever the channel regions are discharged.

A method of operating a semiconductor memory device according to yet another aspect of the present disclosure includes coupling cell strings, comprising memory cells having gates coupled to respective word lines, to respective bit lines, discharging the channel regions of third cell strings including third memory cells and precharging channel regions of remaining cell strings, applying a program pass voltage to unselected word lines, applying a program voltage of a third level to a selected word line in order to raise threshold voltages of the third memory cells, decreasing a level of the program voltage from the third level to a second level and discharging the channel regions of second cell strings including second memory cells in order to raise threshold voltages of the second memory cells, decreasing a level of the program voltage from the second level to a first level and discharging the channel regions of first cell strings including first memory cells in order to raise threshold voltages of the first memory cells, and changing a bit line voltage of bit lines coupled to the second or first cell strings to a program permission level in order to discharge the channel regions of the first or second cell strings in the state in which the cell string is disconnected from the bit line.

When discharging the channel regions of the second cell strings, the bit lines are classified into several bit line groups, and points of time at which the bit line voltages of the bit lines coupled to the second cell strings are changed to the program permission level are differently set every bit line group in order to discharge the channel regions of the second cell strings.

When discharging the channel regions of the second cell strings, the bit lines are classified into several bit line groups, and points of time at which the bit line voltages of the bit lines coupled to the first cell strings are changed to the program permission level are differently set every bit line group in order to discharge the channel regions of the first cell strings.

The program pass voltage rises whenever the channel regions are discharged.

A program inhibition voltage supplied to the bit lines in order to precharge the channel regions rises whenever the channel regions are discharged.

A method of operating a semiconductor memory device according to further yet another aspect of the present disclosure includes coupling cell strings, comprising memory cells having gates coupled to respective word lines, to respective bit lines, discharging the channel regions of third cell strings including third memory cells, from among the memory cells, and precharging channel regions of remaining cell strings, supplying a program pass voltage to unselected word lines, supplying a program voltage of a third level to a selected word line in order to raise threshold voltages of the third memory cells, lowering a level of the program voltage from the third level to a second level and discharging the channel regions of second cell strings including second memory cells, from among the memory cells, in order to raise threshold voltages of the second memory cells, and lowering a level of the program voltage from the second level to a first level and discharging the channel regions of first cell strings including first memory cells, from among the memory cells, in order to raise threshold voltages of the first memory cells. The program pass voltage rises whenever the channel regions are discharged.

A program inhibition voltage supplied to the bit lines in order to precharge the channel regions rises whenever the channel regions are discharged.

During the time for which a voltage level of the unselected word lines rises to a level of the program pass voltage, the coupling of the cell strings and the bit lines is blocked, and a program inhibition voltage supplied to the bit fines in order to precharge the channel regions rises whenever the channel regions are discharged.

A method of operating a semiconductor memory device according to further yet another aspect of the present disclosure includes coupling cell strings, comprising memory cells having gates coupled to respective word lines, to respective bit lines, discharging the channel regions of third cell strings including third memory cells, from among the memory cells, and precharging channel regions of remaining cell strings, supplying a program pass voltage to unselected word lines, supplying a program voltage of a third level to a selected word line in order to raise threshold voltages of the third memory cells, lowering a level of the program voltage from the third level to a second level and discharging the channel regions of second cell strings including second memory cells, from among the memory cells, in order to raise threshold voltages of the second memory cells, and lowering a level of the program voltage from the second level to a first level and discharging the channel regions of first cell strings including first memory cells, from among the memory cells, in order to raise threshold voltages of the first memory cells. Here, a program inhibition voltage supplied to the bit lines in order to precharge the channel regions rises whenever the channel regions are discharged.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 3:
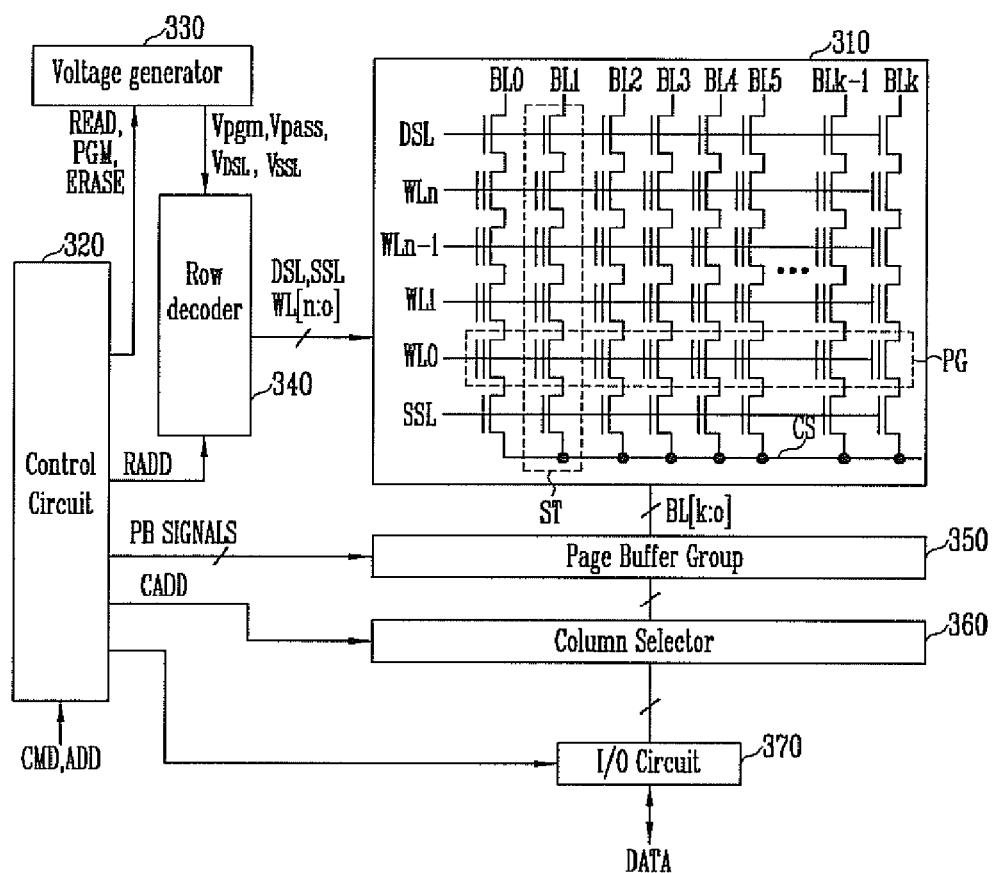
FIG. 3 is a circuit diagram illustrating a semiconductor memory device according to an exemplary embodiment of this disclosure.

FIG. 3 is a circuit diagram illustrating a semiconductor memory device according to an exemplary embodiment of this disclosure.

Referring to FIG. 3, the semiconductor memory device according to the exemplary embodiment of this disclosure includes a memory array 310, a control circuit 320, a voltage generator 330, a row decoder 340, a page buffer group 350, a column selector 360, and an I/O circuit 370.

Figure 1:
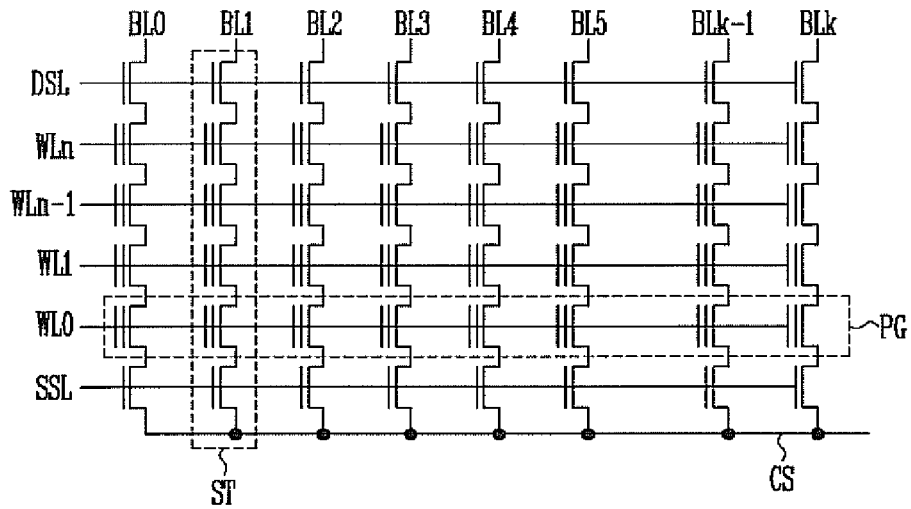
FIG. 1 is a circuit diagram illustrating the memory block of a NAND flash memory device.
Figure 2A:
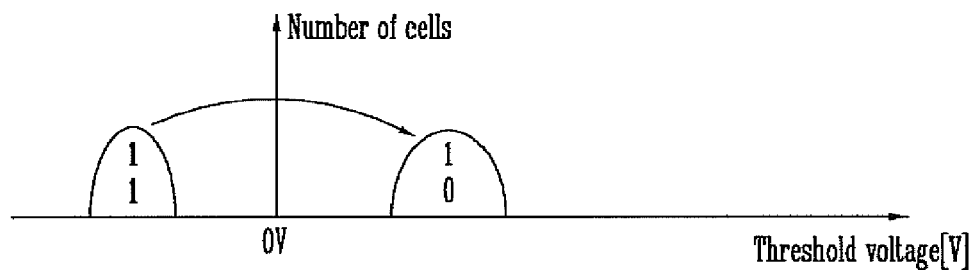
FIGS. 2A and 2B are graphs illustrating a shift of the threshold voltages of memory cells according to a program operation.
Figure 2B:
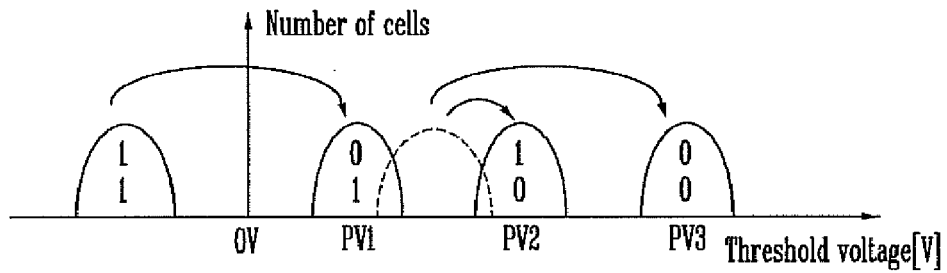

The memory array 310 includes a plurality of memory blocks. Each of the memory blocks has the same construction as the memory block of FIG. 1, and a detailed description thereof is omitted.

The control circuit 320 generates a program operation signal PGM, a read operation signal READ, or an erase operation signal ERASE in response to a command signal CMD and outputs control signals PB SIGNALS for controlling page buffers of the page buffer group 350 according to the types of operations. The control circuit 320 generates a row address signal RADD and a column address signal CADD in response to an address signal ADD.

A voltage supply circuit supplies operating voltages for the program operation, the erase operation, and the read operation of the memory cells to a selected memory block in response to the operation signals READ, PGM, and ERASE of the control circuit 320. The voltage supply circuit includes the voltage generator 330 and the row decoder 340.

The voltage generator 330 generates a program voltage VPGM, a program pass voltage VPASS, a drain selection voltage VDSL, and a source selection voltage VSSL for programming the memory cells in response to the operation signals PGM, READ, and ERASE of the control circuit 320. The voltage generator 330 also generates operating voltages for the read operation and the erase operation of the memory cells.

The row decoder 340 transfers the operating voltages of the voltage generator 330 to a memory block selected from among the memory blocks of the memory array 310 in response to the row address signal RADD of the control circuit 320. That is, the operating voltages are supplied to the local lines DSL, WL[n:0], and SSL of the selected memory block.

The page buffer group 350 includes page buffers (not shown) coupled to the respective bit lines BL[k:0]. The page buffer group 350 supplies voltage (for example, a program inhibition voltage and a ground voltage) for storing data in selected cells to the bit lines BL[k:0] in response to the control signals PB SIGNALS of the control circuit 320.

The column selector 360 selects the page buffers of the page buffer group 350 in response to the column address signal CADD of the control circuit 320. Data latched in the page buffers selected by the column selector 360 is outputted.

The I/O circuit 370 transfers data to the column selector 360 under the control of the control circuit 320 so that external data DATA are inputted to the page buffers of the page buffer group 350 when a program operation is performed. If the data is sequentially inputted to the page buffers of the page buffer group 350 by the column selector 360, the page buffers store the received data in their internal latches.

The control circuit 320 controls the voltage generator 330 in order to control a level of the program voltage VPGM supplied to a selected word line when a program operation is performed on memory cells.

It is assumed that the program voltage VPGM, the program pass voltage VPASS, and the drain selection voltage VDSL described below are outputted by the voltage generator 330 and a bit line voltage VBL supplied to the bit lines BL[k:0] is outputted by the page buffer group 350.

A program operation is performed in order to raise the threshold voltages of memory cells up to different program levels according to data to be stored in the memory cells. In order to store data of 2 bits in a single memory cell, an LSB program operation and an MSB program operation may be performed. In the MSB program operation, the threshold voltages of the memory cells are to be raised up to first to third different program levels. Thus, in one MSB program operation, three program pulses with different program levels are to be supplied three times. Accordingly, the speed of the MSB program operation becomes slow. In order to increase the speed of the MSB program operation, a program voltage of a single pulse which a voltage level varying in incremental steps is supplied to a selected word line. This is described in detail below.

Figure 4A:
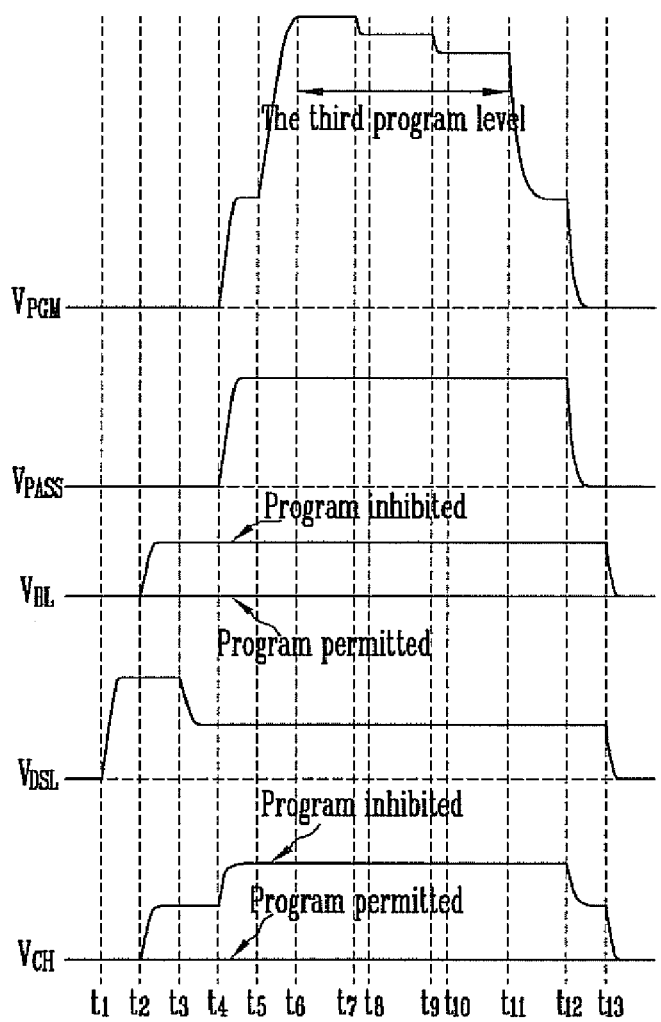
FIGS. 4A to 4C are waveforms illustrating voltages supplied for the program operation of the semiconductor memory device.
Figure 4B:
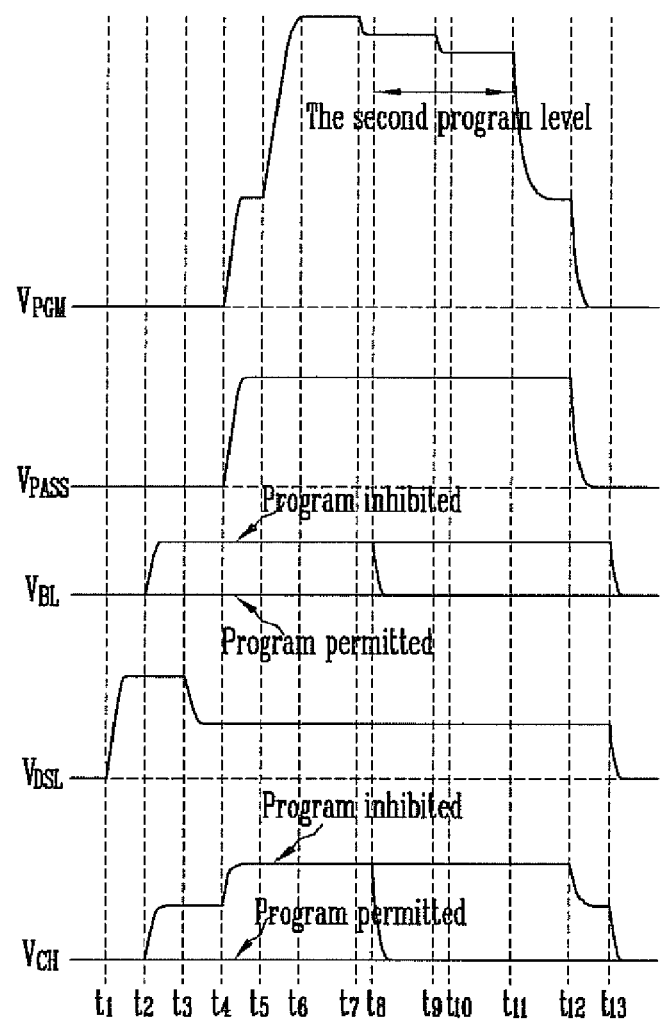
Figure 4C:
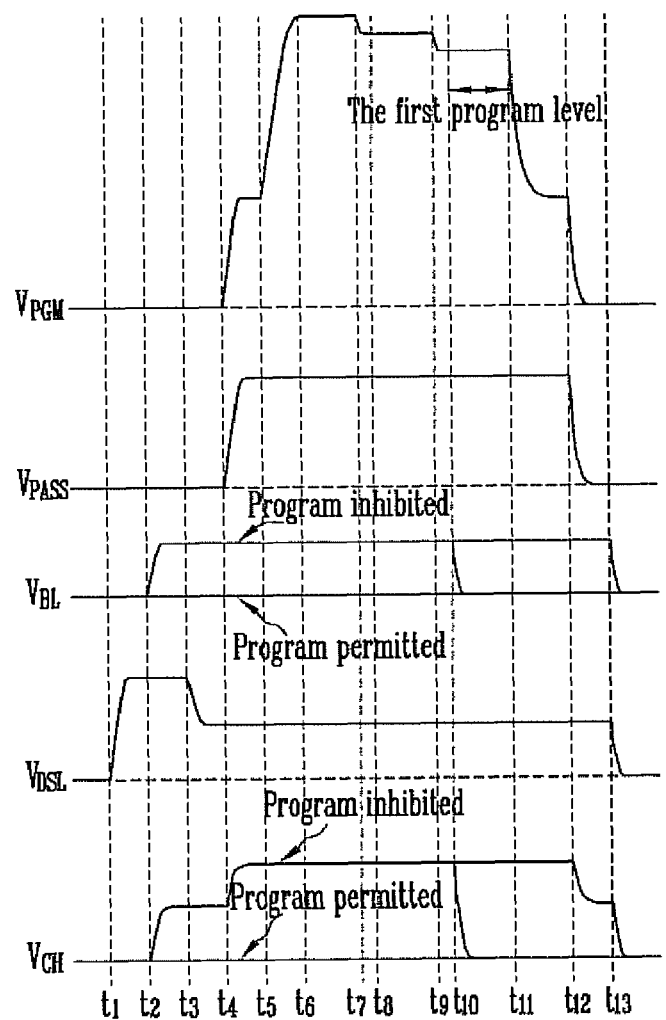

FIGS. 4A to 4C are waveforms illustrating voltages supplied for the program operation of the semiconductor memory device. FIG. 4A is a waveform illustrating voltages supplied to a memory block in case where the threshold voltages of memory cells are raised up to the highest program level (that is, the third program level) from among the first to third program levels.

Referring to FIGS. 3 and 4A, in order to raise the threshold voltages of memory cells up to the first to third program levels according to data to be stored in the memory cells, an MSB program operation is performed. Voltages supplied to a memory block in order to raise the threshold voltages of memory cells of which the threshold voltage are raised up to the third program level (hereinafter referred to as 'third memory cells') are described below.

When the program operation starts, the drain selection voltage VDSL is supplied to the drain select line DSL, and the drain select transistors are turned on by the drain selection voltage VDSL. The bit line voltage VBL of a program inhibition voltage level (for example, a power supply voltage level) or a program permission voltage level (for example, a ground voltage level) is supplied to the bit lines BL0 to BLk according to data to be stored in the memory cells. For example, the bit line voltage VBL of a ground voltage level may be supplied to bit lines coupled to the third memory cells, and the bit line voltage VBL of a power supply voltage level may be supplied to bit lines coupled to the remaining memory cells. When the bit line voltage VBL of a program inhibition level (hereinafter referred to as a 'program inhibition voltage') is supplied to the bit lines in the state in which the drain select transistors are turned on, a channel voltage VCH rises in channel regions within the cell strings. That is, the channel regions of the cell strings are precharged. The drain selection voltage VDSL has such a higher level than a target level that the channel regions of the cell strings are sufficiently precharged. After the channel regions of the cell strings are precharged, the drain selection voltage VDSL drop to the target level.

Next, the program voltage VPGM is supplied to a selected word line coupled to the third memory cell, while the program pass voltage VPASS is supplied to the remaining word lines. At the early stage, the program voltage VPGM has the same level as the program pass voltage VPASS. The threshold voltages of the memory cells are rarely changed during the time for which the program voltage VPGM having the same level as the program pass voltage VPASS is supplied. When the program pass voltage VPASS is supplied, the channel voltage VCH is raised and the drain select transistors are turned off in the cell strings coupled to the bit lines to which the program inhibition voltage is supplied, because a channel boosting phenomenon occurs in the channel regions thereof. However, since a channel boosting phenomenon does not occur in the channel regions of the cell strings including the third memory cells, the channel voltage VCH is maintained at 0 V. Next, in order to raise the threshold voltages of the third memory cells, the program voltage VPGM is supplied to the selected word line up to a target level.

In periods t5 to t12 in which the threshold voltages of memory cells are substantially raised, the program voltage VPGM is supplied to the selected word line in the form of a single step-type pulse having a varying level. The program voltage VPGM is changed from the third level to the first level (that is, the lowest level) via a second level (that is, a middle level). In the first period t6 to t7, the program voltage VPGM is maintained at the third level in order to raise the threshold voltages of the memory cells to the third program level. In the second period t8 to t9, the program voltage VPGM is maintained at the second level in order to raise the threshold voltages up to the second program level. In the third period t10 to t11, the program voltage VPGM is maintained at the first level in order to raise the threshold voltages up to the first program level. In the second period t8 to t9 and the third period t10 to t11, the program voltage VPGM is supplied to raise the threshold voltages up to the second program level or the first program level, but the threshold voltages of the third memory cells can also continue to rise by the program voltage VPGM of the second level and the first level. Accordingly, since they continue to rise even in the second period t8 to t9 and the third period t10 to t11, the time taken that the program voltage VPGM is supplied to raise the threshold voltages of the third memory cells to the third program level can be reduced.

Meanwhile, regarding memory cells whose threshold voltages are to rise up to the second program level (hereinafter referred to as 'second memory cells'), a voltage condition is changed such that the threshold voltages of the second memory cells can be prevented from rising owing to the program voltage VPGM of the third level in the first period t6 to t7 and can be raised only in the second period t8 to t9 and the third period t10 to t11. This is because if the threshold voltages of the second memory cells are raised by the program voltage VPGM of the third level in the first period t6 to t7, the threshold voltages of the second memory cells may become excessively higher than the second program level. This is described in detail below.

FIG. 4B is a waveform illustrating voltages supplied to a memory block in case where the threshold voltages of memory cells are raised up to the second program level lower than the third program level.

Referring to FIGS. 3 and 4B, in order to prevent the threshold voltages of the second memory cells that are to be raised up to the second level from rising due to the program voltage VPGM of the third level in the first period t6 to t7, the program inhibition voltage of the bit line voltage VBL is supplied to the bit lines in the first period t6 to t7. Accordingly, the channel voltage VCH is maintained at a high level by a channel boosting phenomenon occurring in the channel regions of the cell strings including the second memory cells in the first period t6 to t7. Consequently, the second memory cells are set to a program inhibition state, and the threshold voltages of the second memory cells are not raised. If the bit line voltage VBL drops to the ground voltage level when the program voltage VPGM drops to the second level in the second period t8 to t9, the drain select transistor is turned on, and thus the channel voltage VCH of the channel regions is discharged to the bit line. When the channel voltage VCH is discharged, a voltage difference between the channel region and the word line is increased, thereby raising the threshold voltages of the second memory cells. The threshold voltages of the second memory cells also rise in the third period t10 to t11.

That is, a point of time at which the threshold voltages of the memory cells starts rising may be controlled by controlling a level of the bit line voltage VBL. Accordingly, a point of time for raising the threshold voltage of memory cells whose the threshold voltages are to rise up to the first program level (hereinafter referred to as 'first memory cells') may be controlled.

FIG. 4C is a waveform illustrating voltages supplied to a memory block in case where the threshold voltages of memory cells are raised up to the first program level of the first to third program levels.

Referring to FIGS. 3 and 4C, in order to prevent the threshold voltages of the first memory cells that are to be raised up to the first program level from rising by the program voltage VPGM of the third level and second level in the first period t6 to t7 and second period t8 to t9, the bit line voltage VBL supplied to the bit lines is maintained at the program inhibition level in the first period t6 to t7 and second period t8 to t9. Accordingly, the channel voltage VCH is maintained at a high level because of a channel boosting phenomenon occurring in the channel regions of the cell strings including the first memory cells in the first period t6 to t7 and second period t8 to t9. Here, the first memory cells are set to a program inhibition state, and the threshold voltages of the first memory cells do not rise. If the bit line voltage VBL drops to the ground voltage level when the program voltage VPGM drops to the first level in the third period t10 to t11, the drain select transistors are turned on, and thus the channel voltage VCH of the channel regions are discharged to the bit lines. When the channel voltage VCH is discharged, a voltage difference between the channel region and the word line is increased, thereby raising the threshold voltages of the first memory. The threshold voltages of the first memory cells rise by the program voltage VPGM of the first level only in the third period t10 to t11.

However, whenever the supply of the program inhibition voltage VBL is stopped, the channel voltage VCH of the channel regions drops. Accordingly, the threshold voltages of memory cells may abnormally rise.

Figure 5:
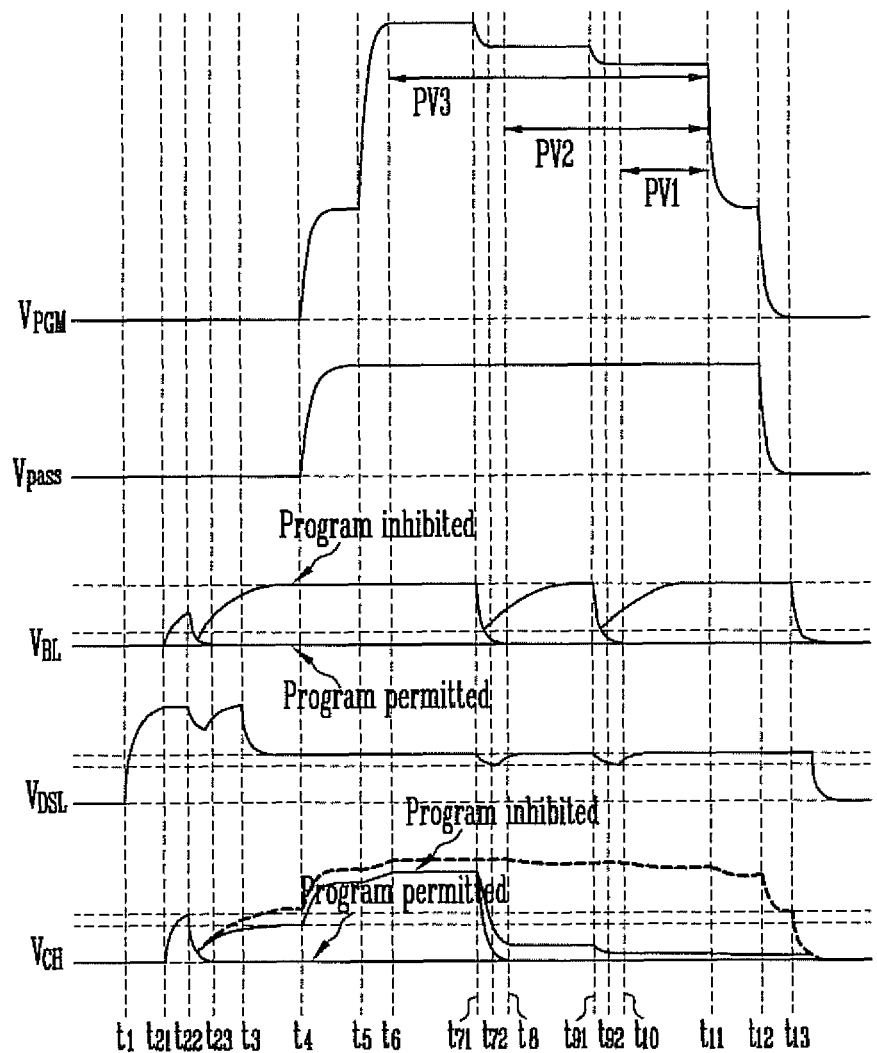
FIG. 5 is a waveform illustrating a change of a channel voltage when the supply of a program inhibition voltage is stopped.

FIG. 5 is a waveform illustrating a change of the channel voltage when the supply of the program inhibition voltage is stopped.

Referring to FIG. 5, the drain selection voltage VDSL and the channel voltage VCH are influenced in three periods by a change of the bit line voltage VBL supplied to bit lines.

In a first period t21 to t3, a program inhibition voltage of the bit line voltage VBL is supplied to all the bit lines and then lowered to a level of the bit line voltage VBL supplied to the bit lines coupled to the third memory cells. Accordingly, the channel regions are not sufficiently precharged and the channel voltage VCH does not rise up to a target level because the channel voltage VCH of the channel regions drops and then rises. A channel voltage indicated by a dotted line corresponds to a normal case, and a channel voltage indicated by a solid line corresponds to a real case.

In a second period t71 to t8, when the program voltage falls from the third level to the second level in order to program the second memory cells, the bit line voltage VBL of the bit lines coupled to the second memory cells drops to a program permission level. When the bit line voltage VBL drops, the drain selection voltage VDSL drops and then rises because of a coupling phenomenon. For this reason, some of voltage precharged in the channel regions of the first memory cells (that is, a program inhibition memory cell) is discharged through the bit lines, thereby lowering the channel voltage VCH. When the channel voltage VCH drops, a voltage difference between the channel region and the word line (that is, a difference between the channel voltage and the program voltage) is increased, and thus the first memory cells of the program inhibition state may be programmed.

In a third period t91 to t10, when the program voltage VPGM falls from the second level to the first level in order to program the first memory cells, the bit line voltage VBL of the bit lines coupled to the first memory cells drops to the program permission level. Here, the drain selection voltage VDSL drops and then rises again, and the channel voltage VCH drops. Accordingly, the threshold voltage of memory cells of a program inhibition state (for example, memory cells that are to be maintained in an erase state) may rise.

Accordingly, the channel voltage VCH of the channel regions is to be prevented from lowering because of discharge when the bit line voltage VBL is changed. A first method of controlling timing when bit lines are coupled and decoupled with cell strings in order to prevent the channel voltage VCH from being discharged is described below.

FIGS. 6 to 9 are diagrams illustrating voltages supplied for the program operation of the semiconductor memory device.

Figure 6:
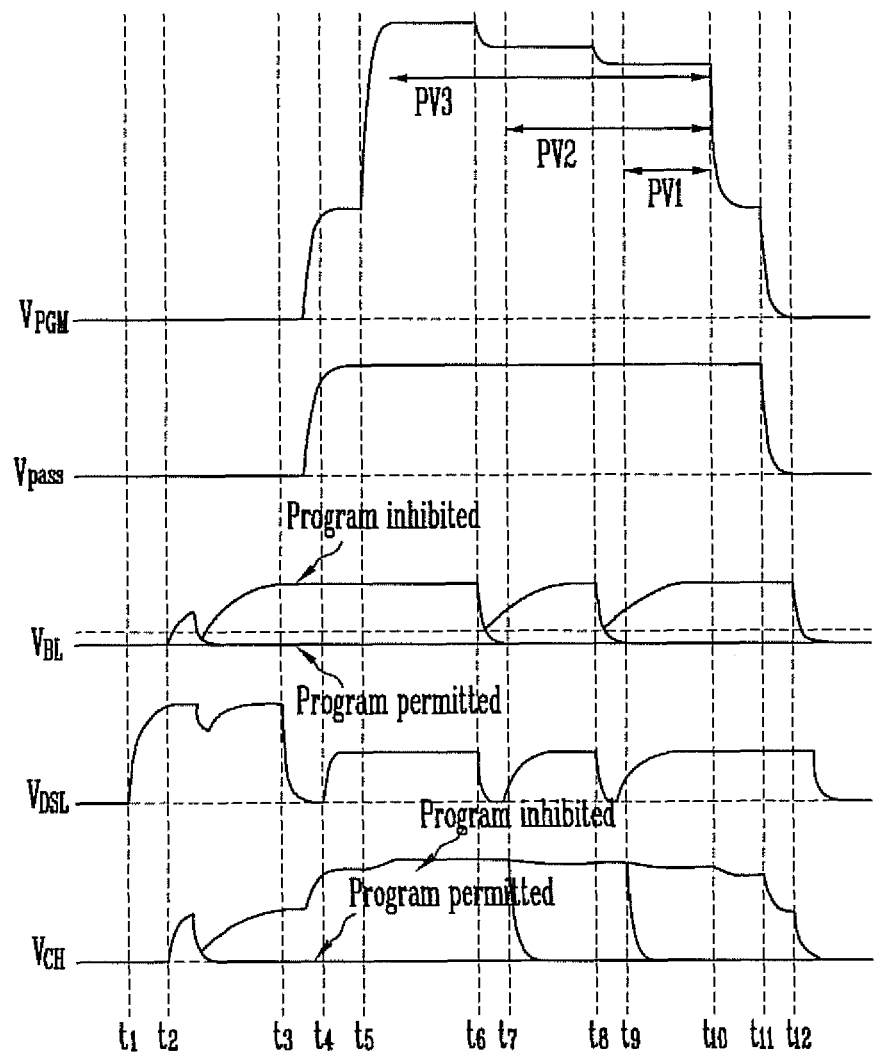
FIGS. 6 to 9 are diagrams illustrating voltages supplied for the program operation of the semiconductor memory device.

Referring to FIGS. 3 and 6, when the drain selection voltage VDSL is supplied in a period t1 to t3, the drain select transistors of the cell strings ST are turned on. Accordingly, the cell strings including the memory cells coupled in series are coupled to the respective bit lines BL0 to BLk. The drain selection voltage VDSL is supplied with a level higher than a program inhibition level of a bit line voltage VBL supplied later.

Next, the channel regions of third cell strings including third memory cells whose threshold voltages are to be raised up to the third program level in order to store third program data, from among memory cells coupled to a selected word line, are discharged, and the channel regions of the remaining cell strings are precharged. For example, while raising voltage of all the bit lines BL0 to BLk, the bit line voltage VBL of bit lines coupled to the third memory cells (or the third cell strings) may drop to a program permission level, and the bit line voltage VBL of the remaining bit lines may be raised up to the program inhibition level. When the bit line voltage VBL of the bit lines drops to the program permission level, the bit line voltage VBL of the remaining bit lines drops and then rises because of an interference phenomenon. Therefore, a channel voltage VCH of the channel regions of the third cell strings is maintained at a ground voltage level (that is, the program permission level), and the channel voltage VCH of the channel regions of the remaining cell strings is raised according to a change of the bit line voltage VBL.

Meanwhile, since the drain selection voltage VDSL having a level higher than the program inhibition level is supplied, the bit line voltage VBL may be transferred to the channel regions of the cell strings without a voltage drop due to the threshold voltages of the drain select transistors, and the channel voltage VCH may be raised up to the program inhibition level.

In a period t3 to t4, a program pass voltage VPASS is supplied to the unselected word lines. In order to raise the threshold voltages of the third memory cells, a program voltage VPGM is supplied to the selected word line. At the early stage, the program voltage VPGM is raised up to the same level as the program pass voltage VPASS. When the program voltage VPGM and the program pass voltage VPASS are supplied, the channel voltage VCH rises because of a channel boosting phenomenon. When the channel voltage VCH rises higher than the bit line voltage VBL of the program inhibition level, the channel voltage VCH may be discharged to the bit lines. When the channel voltage VCH drops, a difference between the channel voltage VCH and the program voltage VPGM is increased, and thus the threshold voltages of the memory cells of the program inhibition state may rise.

Accordingly, in order to block the coupling of the cell strings with the bit lines during the time for which a voltage level of the unselected word lines rises up to a target level of the program pass voltage VPASS, the supply of the drain selection voltage VDSL is stopped before the program voltage VPGM and the program pass voltage VPASS are supplied. When the coupling between the cell strings and the bit lines is blocked, the channel voltage VCH can be prevented from lowering because it is discharged through the bit lines, although the channel voltage VCH rises.

In a period t4 to t5, the drain selection voltage VDSL is supplied again. The drain selection voltage VDSL preferably is supplied with the same level as the bit line voltage VBL of the program inhibition level. In this case, since a level of the drain selection voltage VDSL is the same as a level of the bit line voltage VBL, but lower than a level of the channel voltage VCH, the drain select transistors remain in the turn-off state.

In a period t5 to t6, in order to raise the threshold voltages of the third memory cells in which the third program data is stored up to the third program level PV3, the program voltage VPGM is raised up to the third level. The channel voltage VCH further rises because of the rise of the program voltage VPGM. Particularly, the channel voltage VCH is maintained at 0 V in the channel regions of the cell strings including the third memory cells. Accordingly, the threshold voltages of the third memory cells rise because of a voltage difference between the channel voltage VCH and the program voltage VPGM. However, the channel voltage VCH is maintained at a high level in the channel regions of the cell strings including memory cells of a program inhibition state, such as memory cells maintained in an erase state, second memory cells whose threshold voltages are to rise up to the second program level, and first memory cells whose threshold voltages are to rise up to the first program level. For this reason, a voltage between the channel voltage VCH and the program voltage VPGM is small, and the threshold voltages of the memory cells of a program inhibition state do not rise.

In a period t6 to t8, the level of the program voltage VPGM drops from the third level to the second level. Next, in order to raise the threshold voltages of the second memory cells in which second program data is stored up to the second program level PV2, the channel regions of second cell strings including the second memory cells are discharged. More particularly, the bit line voltage VBL of bit lines coupled to the second cell strings including the second memory cells drops from the program inhibition level to a program permission level (that is, the ground voltage level). Accordingly, the drain select transistors are turned on, and thus the channel voltage VCH is discharged to the bit lines through the drain select transistors from the channel regions of the second cell strings. When the channel voltage VCH drops, a voltage difference between the channel voltage VCH and the program voltage VPGM is increased, and thus the threshold voltages of the second memory cells rise. Since the third memory cells are maintained at a program permission state, the threshold voltages of the third memory cells rise together with the threshold voltages of the second memory cells.

Meanwhile, in the period t6 to t7 in which the program voltage VPGM drops and the bit line voltage VBL supplied to the bit lines coupled to the second cell strings drops from the program inhibition level to the program permission level, the bit line voltage VBL of all the bit lines BL0 to BLk may temporarily drop because of an interference phenomenon. In this case, the channel voltage VCH may be discharged from the channel regions of the cell strings to the bit lines BL0 to BLk. In order to prevent such discharge, in the period t6 to t7, a level of the bit line voltage VBL is changed to the program permission level in the state in which the coupling between the cell strings and the bit lines is blocked. In order to block the coupling between the cell strings and the bit lines, the supply of the drain selection voltage VDSL is stopped, and thus the drain select transistors are turned off. Next, in the period t7 to t8, the drain selection voltage VDSL is supplied to connect the cell strings with the bit lines again. When the cell strings and the bit lines are connected again, the channel voltage VCH is discharged to the bit lines BL0 to BLk.

In a period t8 to t10, the level of the program voltage VPGM drops from the second level to the first level. In order to raise the threshold voltages of the first memory cells in which first program data is stored up to the first program level PV1, the channel voltage VCH is discharged in the channel regions of first cell strings including the first memory cells. More particularly, the bit line voltage VBL of bit lines, coupled to the first cell strings including the first memory cells, drops from the program inhibition level to the program permission level. Accordingly, a voltage difference between the channel voltage VCH and the program voltage VPGM is increased, and thus the threshold voltages of the first memory cells rise. In this case, since the third and second memory cells also remain in the program permission state, the threshold voltages of the third and second memory cells rise along with the threshold voltages of the first memory cells.

Meanwhile, like in the period t6 to t7, in the period t8 to t9, the level of the bit line voltage VBL is changed to the program permission level in the state in which the coupling between the cell strings and the bit lines is blocked.

In a period t10 to t11, the program voltage VPGM drops to the same level as the program pass voltage VPASS. Next, in a period t11 to t12, the supply of the program voltage VPGM and the program pass voltage VPASS is stopped. Thus, a single program operation using a single step-type program pulse in order to raise the threshold voltages of the first to third memory cells up to the first to third program levels PV1, PV2, and PV3 is completed.

Next, first to third program verification operations for checking whether the threshold voltages of the first to third memory cells have risen up to the first to third program levels PV1, PV2, and PV3 are performed. The program verification operation is well known in the art, and a detailed description thereof is omitted. If there is a memory cell having a threshold voltage not reached a target program level, the program operation is performed again using the single step-type program pulse for raising the threshold voltage of the corresponding memory cells up to the first to third program levels PV1, PV2, and PV3.

A second method of controlling the program pass voltage VPASS in order to prevent the channel voltage VCH from being discharged is described below.

Figure 7:
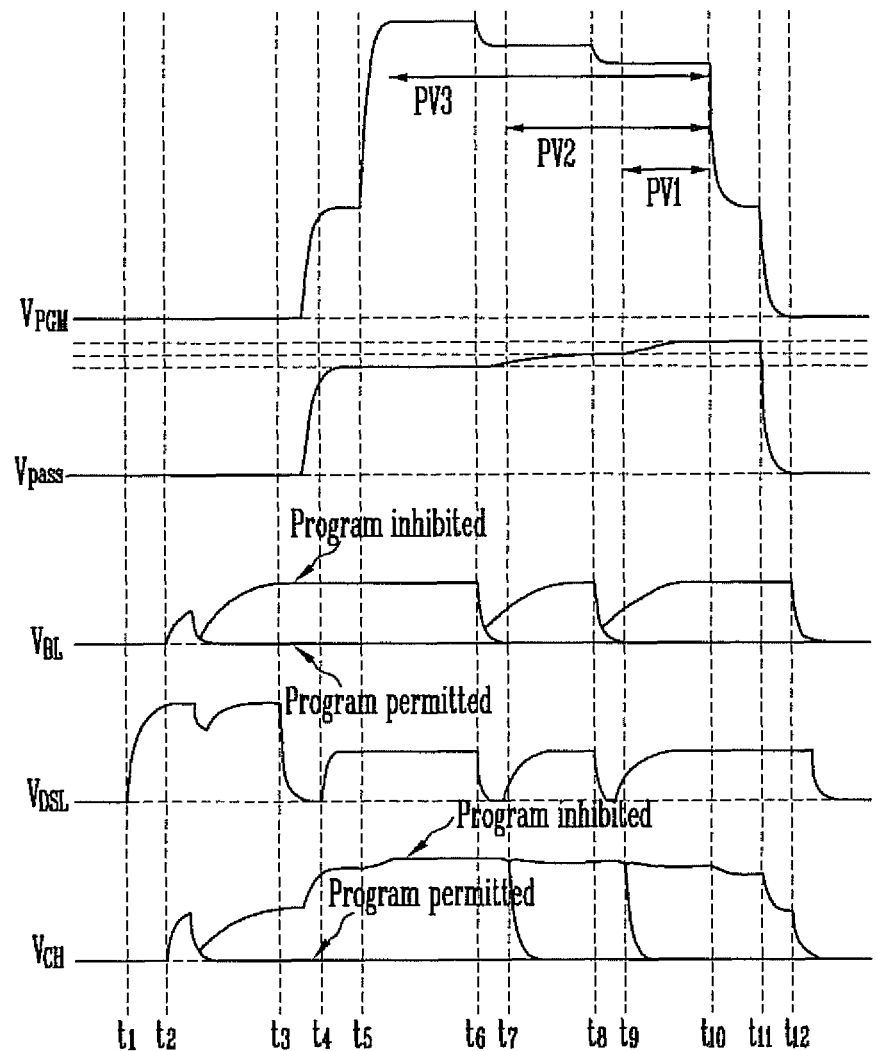

Referring to FIGS. 3 and 7, the operation in a period t1 to t6 is the same as that in the period t1 to t6 of FIG. 6, and a description thereof is omitted. Although timing when the bit lines are coupled with the cell strings is controlled using the drain selection voltage VDSL, the channel voltage VCH may drop because of the influence of interference due to the discharge of the channel voltage VCH in other strings, the leakage current, or other causes. In order to prevent such influence, a level of the program pass voltage VPASS is raised in a period t6 to t8. When the program pass voltage VPASS rises, channel boosting occurs by capacitor coupling, and thus the channel voltage VCH additionally rises. Accordingly, the threshold voltages of memory cells of a program inhibition state can be prevented from rising because a reduction in the difference between the channel voltage VCH and the program voltage VPGM is prevented. Likewise, even in a period t8 to t10, the channel voltage VCH may be raised by raising the program pass voltage VPASS. That is, an abnormal drop of the channel voltage VCH is compensated by raising a level of the program pass voltage VPASS whenever the channel voltage VCH of the channel regions is discharged.

A third method of controlling a level of the bit line voltage VBL supplied to bit lines in order to prevent the channel voltage VCH from being discharged is described below.

Figure 8:
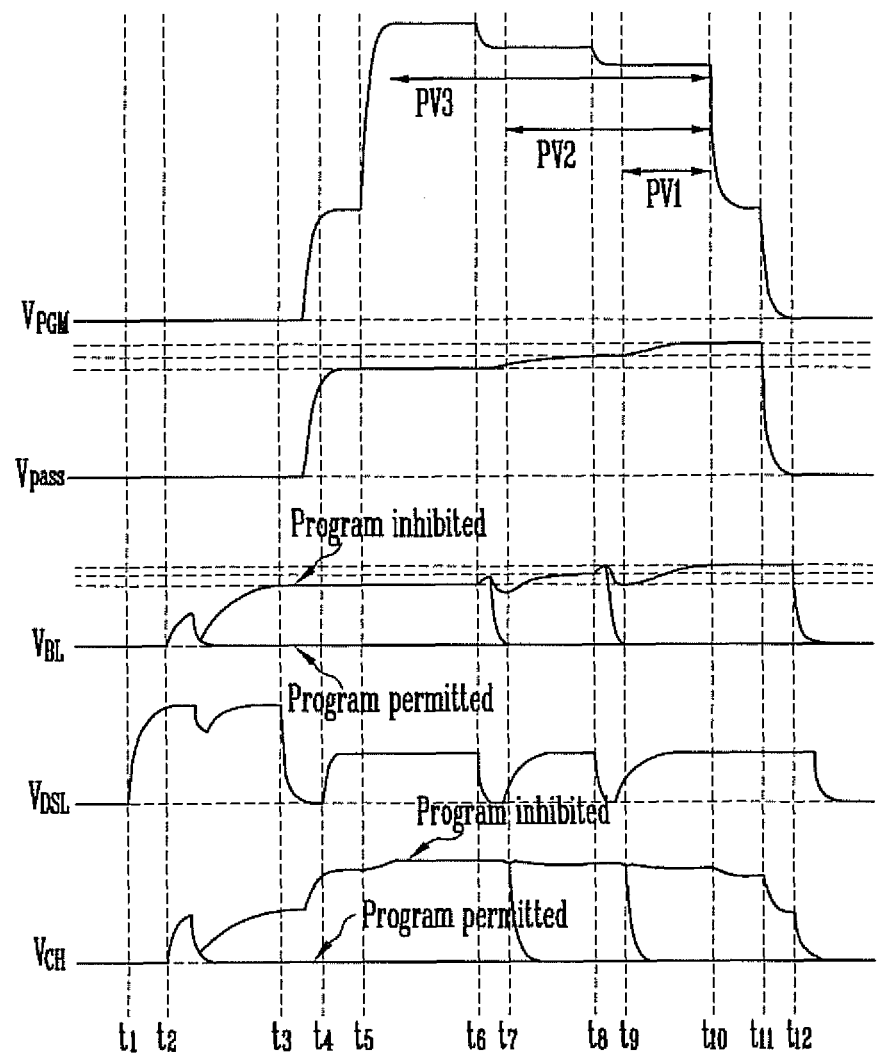

Referring to FIGS. 3 and 8, the operation in a period t1 to t6 is the same as that in the period t1 to t6 of FIG. 6, and a description thereof is omitted. In a period t6 to t8, when a level of the bit line voltage VBL drops to a program permission level in order to discharge the channel voltage VCH of channel regions of cell strings including second memory cells from among the memory cells, the bit line voltage VBL maintained at a program inhibition level in other bit lines may temporarily drop because of an interference phenomenon. If the bit line voltage VBL of the program inhibition level drops even though the coupling between the bit lines and the cell strings is blocked, the channel voltage VCH may be influenced. In order to prevent such influence, when a level of the bit line voltage VBL drops to the program permission level in some bit lines, the bit line voltage VBL of the program inhibition level is raised. In other words, if the program inhibition level of the bit line voltage VBL is raised when a level of the bit line voltage VBL drops to the program permission level in some bit lines, the bit line voltage VBL of the program inhibition level can be prevented from dropping. Likewise, even in a period t8 to t10, when a level of the bit line voltage VBL drops to program permission level in some bit lines, the bit line voltage VBL of the program inhibition level is raised. That is, the program inhibition voltage supplied to the bit lines is raised whenever the channel voltage VCH of the channel regions is discharged. Accordingly, the channel voltage VCH can be prevented from dropping abnormally.

Meanwhile, when a level of the program voltage drops from the third level to the second level in order to raise the threshold voltages of the second memory cells to the second program level, the bit line voltage VBL of the bit lines coupled to the second memory cells is illustrated to drop from the program inhibition level to the program permission level. However, if the bit lines are classified into several groups and the bit line voltage VBL drops to the program permission level at different points of time on a group basis, an interference phenomenon to the bit line voltage VBL of the bit lines that are to maintain the program inhibition level can be minimized. The above operation may be likewise applied to a case where a level of the program voltage drops from the second level to the first level in order to raise the threshold voltages of the first memory cells to the first program level. This is described in detail below.

Figure 9:
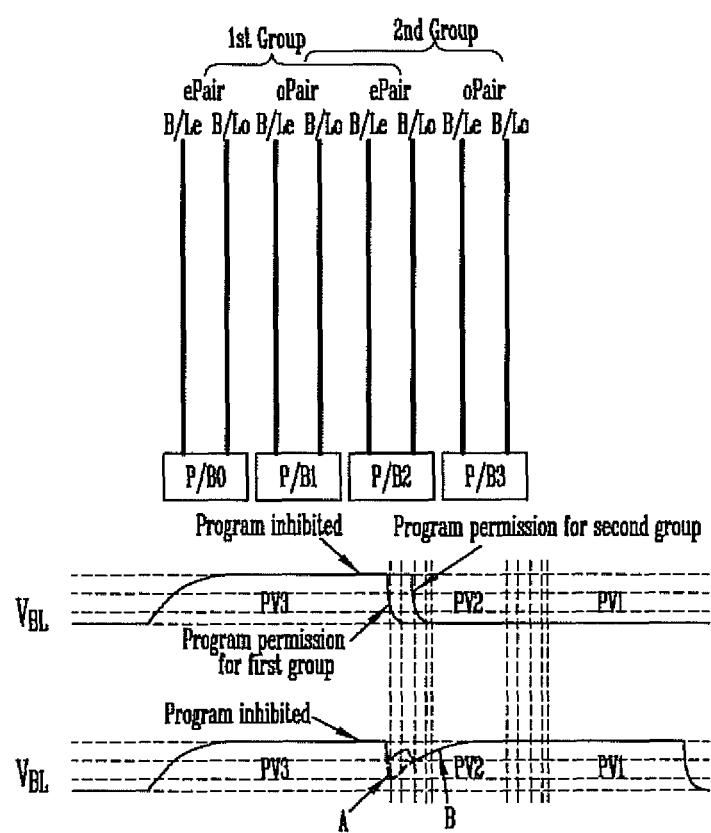

Referring to FIG. 9, the bit lines may include even bit lines B/Le and odd bit lines B/Lo. The even bit line B/Le and the odd bit line B/Lo adjacent to each other are grouped as one sub-bit line group ePair. oPair and coupled to one of page buffers P/B0. P/B1. P/B2. P/B3. Here, the even sub-bit line groups form a first bit line group $1^{st}$ group, and the odd sub-bit line groups form a second bit line group $2^{nd}$ group.

During the time for which the program voltage of the third level is supplied in order to raise the threshold voltages of the third memory cells to the third program level, the bit line voltage VBL of the bit lines coupled to the second memory cells maintains the program inhibition level. Next, when the program voltage drops from the third level to the second level in order to raise the threshold voltages of the second memory cells to the second program level, the bit line voltage VBL of the bit lines coupled to the second memory cells drops to the program permission level. The bit line voltage VBL of the bit lines coupled to the second memory cells and included in the first bit line group first drops to the program permission level, and the bit line voltage VBL of the bit lines coupled to the second memory cells and included in the second bit line group then drops to the program permission level.

When the bit line voltage VBL of all the bit lines coupled to the second memory cells drops to the program permission level at the same time, the bit line voltage VBL of other bit lines that are to maintain the program inhibition level may significantly drops because of an interference phenomenon, as indicated by 'A'. Accordingly, the amount of a channel voltage discharged in the channel regions of memory cells of a program inhibition state can be increased.

However, when the bit line voltage VBL of the bit lines coupled to the second memory cells drops on a group basis, the bit line voltage VBL of the other bit lines that are to maintain the program inhibition level slightly drops, as indicated by 'B', and then rises to the program inhibition level. Accordingly, the amount of a channel voltage discharged in the channel regions of memory cells of a program inhibition state can be decreased.

As in the case of the second memory cells, the amount of a channel voltage discharged in the channel regions of memory cells of a program inhibition state can be decreased by lowering the bit line voltage VBL of the bit lines, coupled to the first memory cells, to the program permission level on a group basis. If, as described above, the bit lines are classified into several groups and the bit line voltages drop to the program permission level at different timings on a group basis, an interference phenomenon to other bit line voltages can be minimized. The bit line voltages VBL can drop at different points of time on a group basis not only in the above described case where the page buffer is coupled to a pair of the bit lines, but also in a case where the page buffer is coupled to one bit line.

The methods suggested to prevent a drop of the channel voltage may be independently applied or one or more methods may be applied at the same time.

In accordance with the present disclosure, the speed of a program operation can be increased by raising the threshold voltages of memory cells to different levels using a program voltage of a single step-type pulse. Furthermore, errors in a program operation can be prevented by preventing a drop of a channel voltage in the channel regions of memory cells, set to a program inhibition state, because of a change of voltages supplied when the program operation is performed.

What is claimed is:

1. A method of operating a semiconductor memory device, comprising:
    coupling cell strings, comprising memory cells having gates coupled to respective word lines, to respective bit lines;
    discharging channel regions of third cell strings including third memory cells and precharging channel regions of remaining cell strings;
    applying a program pass voltage to unselected word lines;
    applying a program voltage of a third level to a selected word line in order to raise threshold voltages of the third memory cells;
    decreasing a level of the program voltage from the third level to a second level and discharging channel regions of second cell strings including second memory cells in order to raise threshold voltages of the second memory cells; and
    decreasing a level of the program voltage from the second level to a first level and discharging channel regions of first cell strings including first memory cells in order to raise threshold voltages of the first memory cells,
    wherein the cell strings are disconnected from a bit line while a voltage level of the unselected word lines rises to a level of the program pass voltage.

2. The method of claim 1, wherein discharging the channel regions comprises;
    changing a bit line voltage to a program permission level in a state in which the cell strings are disconnected from the bit lines;
    connecting the cell string to the bit line; and
    discharging the channel regions.

3. The method of claim 1, wherein the program pass voltage is increased whenever the channel regions are discharged.

4. The method of claim 1, wherein a program inhibition voltage applied to the bit line in order to precharge the channel regions is increased whenever the channel regions are discharged.

5. A method of operating a semiconductor memory device, comprising:
    coupling cell strings, comprising memory cells having gates coupled to respective word lines, to respective bit lines;
    discharging channel regions of third cell strings including third memory cells and precharging channel regions of remaining cell strings;
    applying a program pass voltage to unselected word lines;
    applying a program voltage of a third level to a selected word line in order to raise threshold voltages of the third memory cells;
    decreasing a level of the program voltage from the third level to a second level and discharging channel regions of second cell strings including second memory cells in order to raise threshold voltages of the second memory cells;

decreasing a level of the program voltage from the second level to a first level and discharging channel regions of first cell strings including first memory cells in order to raise threshold voltages of the first memory cells; and changing a bit line voltage of bit lines coupled to the second or first cell strings to a program permission level in order to discharge the channel regions of the first or second cell strings in a state in which the cell string is disconnected from the bit line.

6. The method of claim 5, wherein a program inhibition voltage applied to the bit lines in order to precharge the channel regions is increased whenever the channel regions are discharged.

7. The method of claim 5, wherein discharging the channel regions of the second cell strings comprises;
classifying the bit lines into several bit line groups; and
differently setting a timming at which the bit line voltages of the bit lines coupled to the second cell strings are changed to the program permission level to each of the bit line groups in order to discharge the channel regions of the second cell strings.

8. The method of claim 5, wherein discharging the channel regions of the first cell strings comprises;
classifying the bit lines into several bit line groups; and
differently setting a timming at which the bit line voltages of the bit lines coupled to the first cell strings are changed to the program permission level to each of the bit line groups in order to discharge the channel regions of the first cell strings.

9. The method of claim 5, wherein the program pass voltage is increased whenever the channel regions are discharged.

10. The method of claim 9, wherein a program inhibition voltage applied to the bit lines in order to precharge the channel regions is increased whenever the channel regions are discharged.

11. A method of operating a semiconductor memory device, comprising:
coupling cell strings, comprising memory cells having gates coupled to respective word lines, to respective bit lines;
discharging channel regions of third cell strings including third memory cells and precharging channel regions of remaining cell strings;
applying a program pass voltage to unselected word lines;
applying a program voltage of a third level to a selected word line in order to raise threshold voltages of the third memory cells;

decreasing a level of the program voltage from the third level to a second level and discharging channel regions of second cell strings including second memory cells in order to raise threshold voltages of the second memory cells; and decreasing a level of the program voltage from the second level to a first level and discharging channel regions of first cell strings including first memory cells in order to raise threshold voltages of the first memory cells, wherein the program pass voltage is increased whenever the channel regions are discharged.

12. The method of claim 11, wherein a program inhibition voltage applied to the bit lines in order to precharge the channel regions is increased whenever the channel regions are discharged.

13. The method of claim 11, wherein:
the cell strings are disconnected form the bit lines while a voltage level of the unselected word lines is increased to a level of the program pass voltage, and
a program inhibition voltage applied to the bit lines in order to precharge the channel regions is increased whenever the channel regions are discharged.

14. A method of operating a semiconductor memory device, comprising:
coupling cell strings, comprising memory cells having gates coupled to respective word lines, to respective bit lines;
discharging channel regions of third cell strings including third memory cells and precharging channel regions of remaining cell strings;
applying a program pass voltage to unselected word lines;
applying a program voltage of a third level to a selected word line in order to raise threshold voltages of the third memory cells;
decreasing a level of the program voltage from the third level to a second level and discharging channel regions of second cell strings including second memory cells in order to raise threshold voltages of the second memory cells; and
decreasing a level of the program voltage from the second level to a first level and discharging channel regions of first cell strings including first memory cells in order to raise threshold voltages of the first memory cells,
wherein a program inhibition voltage applied to the bit lines in order to precharge the channel regions is increased whenever the channel regions are discharged.

* * * * *